United States Patent
Tsai et al.

(10) Patent No.: US 8,982,634 B2
(45) Date of Patent: Mar. 17, 2015

(54) FLASH MEMORY

(71) Applicant: eMemory Technology Inc., Hsin-Chu (TW)

(72) Inventors: Yu-Hsiung Tsai, Hsinchu (TW); Yuan-Tai Lin, Hsinchu (TW); Ching-Yuan Lin, Hsinchu County (TW); Chao-Wei Kuo, Taipei (TW); Shang-Wei Fang, Yilan County (TW); Wein-Town Sun, Taoyuan County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 14/152,467

(22) Filed: Jan. 10, 2014

(65) Prior Publication Data
US 2014/0119125 A1    May 1, 2014

Related U.S. Application Data

(62) Division of application No. 13/546,036, filed on Jul. 11, 2012, now Pat. No. 8,817,543.

(51) Int. Cl.
*G11C 11/34* (2006.01)
*G11C 13/00* (2006.01)
*G11C 16/04* (2006.01)
*G11C 16/12* (2006.01)

(52) U.S. Cl.
CPC .......... *G11C 13/0069* (2013.01); *G11C 16/04* (2013.01); *G11C 16/12* (2013.01); *G11C 13/0064* (2013.01)
USPC .............. 365/185.18; 365/185.21; 365/185.2; 365/185.23; 365/189.07

(58) Field of Classification Search
CPC ........... G11C 13/0069; G11C 13/0064; G11C 16/04; G11C 16/12
USPC ............... 365/185.18, 185.21, 185.2, 185.23, 365/189.07
See application file for complete search history.

(56) References Cited

U.S. PATENT DOCUMENTS

| | | | |
|---|---|---|---|
| 5,499,211 A | 3/1996 | Kirihata et al. | |
| 5,689,460 A | * 11/1997 | Ooishi | ...................... 365/189.07 |
| 5,768,191 A | 6/1998 | Choi et al. | |

(Continued)

FOREIGN PATENT DOCUMENTS

| | | |
|---|---|---|
| JP | 2001015716 | 1/2001 |
| JP | 2001015716 A | 1/2001 |

(Continued)

OTHER PUBLICATIONS

United States Patent and Trademark Office, "Office Action", Jan. 27, 2014.

(Continued)

*Primary Examiner* — Viet Q Nguyen
(74) *Attorney, Agent, or Firm* — WPAT, PC; Justin King

(57) ABSTRACT

The present invention provides a flash memory including a memory cell, a current limiter and a program voltage generator. The memory cell is programmed in response to a program current and a program voltage. The current limiter reflects amount of the program current by a data-line signal, e.g., a data-line voltage. The program voltage generator generates and controls the program voltage in response to the data-line voltage, such that the program current can track to a constant reference current.

15 Claims, 13 Drawing Sheets

(56) References Cited

U.S. PATENT DOCUMENTS

| | | | |
|---|---|---|---|
| 6,219,279 | B1 | 4/2001 | Manolescu et al. |
| 6,865,110 | B1 | 3/2005 | Park et al. |
| 7,075,841 | B2 * | 7/2006 | Resta et al. ............... 365/189.16 |
| 7,251,163 | B2 * | 7/2007 | O ............................. 365/185.18 |
| 7,532,522 | B2 * | 5/2009 | Hsu et al. ................. 365/189.09 |
| 7,768,817 | B2 | 8/2010 | Yamada |
| 7,808,842 | B1 | 10/2010 | Raghavan et al. |
| 7,859,906 | B1 | 12/2010 | Vispute et al. |
| 7,869,258 | B2 | 1/2011 | Scheuerlein et al. |
| 7,889,547 | B2 * | 2/2011 | Sheu et al. .................... 365/163 |
| 7,916,518 | B2 | 3/2011 | Yamada |
| 7,969,804 | B1 | 6/2011 | Hirose et al. |
| 8,054,698 | B2 * | 11/2011 | De Sandre et al. ...... 365/189.16 |
| 8,264,872 | B2 * | 9/2012 | De Sandre et al. ........... 365/163 |
| 8,279,684 | B2 * | 10/2012 | Chen et al. ............... 365/189.09 |
| 8,369,130 | B2 | 2/2013 | Maejima |
| 8,446,753 | B2 | 5/2013 | Kim et al. |
| 8,467,245 | B2 * | 6/2013 | Fang et al. ............... 365/185.15 |
| 8,582,354 | B1 * | 11/2013 | Li et al. ......................... 365/158 |
| 8,605,493 | B2 * | 12/2013 | Sheu et al. .................... 365/158 |
| 8,634,225 | B2 * | 1/2014 | Kang ............................. 365/148 |
| 8,717,802 | B2 * | 5/2014 | Lam et al. ..................... 365/148 |
| RE45,035 | E * | 7/2014 | Lin et al. ....................... 365/163 |
| 8,817,543 | B2 * | 8/2014 | Tsai et al. ................. 365/185.18 |
| 2012/0087192 | A1 | 4/2012 | Fang et al. |

FOREIGN PATENT DOCUMENTS

| | | |
|---|---|---|
| JP | 2003203488 | 7/2003 |
| JP | 2004055012 | 2/2004 |
| JP | 2004055012 A | 2/2004 |
| JP | 2003203488 A | 7/2006 |
| WO | 2006059373 | 6/2006 |
| WO | 2007059373 A1 | 5/2007 |

OTHER PUBLICATIONS

Japan Patent Office, "Office Action", Sep. 19, 2013.
Japan Patent Office, "Office Action", Jan. 9, 2014.

* cited by examiner

FLASH MEMORY

CROSS-REFERENCE TO RELATED APPLICATION

This is a Divisional application of co-pending application Ser. No. 13/546,036 filed Jul. 11, 2012. The disclosure of the prior application is hereby incorporated by reference herein in its entirety.

FIELD OF THE INVENTION

The present invention relates to a flash memory, and more particularly, to a PMOS flash memory including support circuitry for dynamically controlling a program voltage such that a program current can track to a constant reference current during programming.

BACKGROUND OF THE INVENTION

Flash memory provides a good solution for electronically programmable (re-writeable) non-volatile data storage, and is therefore broadly utilized. Flash memory includes a memory array formed by a plurality of memory cells; each memory cell stores a binary bit by a storage transistor, such as a metal-oxide-semiconductor (MOS) field effect transistor including a gate, a drain, a source and a charge storage structure such as a floating gate.

To program a memory cell, i.e. to write a binary bit of data to a storage transistor of the memory cell, a drain voltage and a control-line program voltage are respectively applied to the drain and the gate of the transistor, such that charges (electrons) are injected to the floating gate, and hence the threshold voltage of the storage transistor is changed to memorize the bit. During programming, however, varying threshold voltage of the storage transistor also affects conduction of the storage transistor. For example, programming a p-channel MOS (PMOS) storage transistor raises its threshold voltage; as a result, the PMOS storage transistor tends to conduct greater drain current if the program voltage applied to the gate remains fixed during programming. Greater drain current requires to be supplied by circuitry of larger layout area and higher power consumption. In addition, greater drain current impacts efficiency of programming and reliability of memory cell, because greater drain current induces effect of channel hot hole in the channel between the drain and the source of the storage transistor. As the induced hot holes inject to the floating gate, electrons in the floating gate are annihilated to slow down the programming, and the gate oxide enclosing the floating gate suffers from extra damage.

In a prior art programming of a flash memory of PMOS storage transistors, if a first programming attempt for a storage transistor is verified to be failed, the control-line voltage applied to the gate of the storage transistor is increased to a predetermined second level higher than that of the first programming attempt, and is then constantly kept at the second level during a fixed interval for a second programming attempt. If the second programming attempt is verified to be failed, the control-line voltage is again increased to a predetermined third level higher than the second level used during the second program attempt, and then constantly remains the third level during a following fixed interval for a third programming attempt. That is, in response to failure of each programming attempt, the control-line voltage is increased to a higher constant level during a following fixed interval for a next programming attempt, until the control-line voltage reaches a predetermined maximum level.

SUMMARY OF THE INVENTION

The present invention aims to provide a flash memory of a more adaptive programming scheme, which dynamically adjusts control-line voltage (program voltage) during programming of a storage transistor of a memory cell, such that its drain current can track to a constant reference current, i.e., be kept in proximity of the reference current. By maintaining a substantial constant gate current during programming, the programming scheme of the invention can therefore avoid impacts due to effect of channel hot hole, enhance programming efficiency, reduce layout area and decrease power consumption.

An objective of the invention is to provide a flash memory includes a memory cell (a PMOS memory cell for example), a current limiter and a program voltage generator. The memory cell is capable of being programmed in response to a program current of a bit-line and a program voltage of a control-line terminal, respectively applied to a drain and a gate of a PMOS storage transistor of the memory cell. The current limiter is coupled to the bit-line for reflecting amount of the program current by a data-line signal (e.g., a data-line voltage) of a data-line terminal, and receiving a reference current. The program voltage generator, coupled to the control-line terminal and the data-line terminal, is arranged to generate the program voltage in response to the data-line signal, such that the program current tracks to the reference current. In an embodiment, the program voltage generator is arranged to raise the program voltage in response to a rising tendency of the program current.

In an embodiment, the program voltage generator includes a first amplifier, which has a pair of first input terminals and a first output terminal respectively coupled to the data-line terminal, a reference voltage and the control-line terminal. The current limiter includes a first transistor and a second transistor. The first transistor has a first gate and a first drain, and the first drain is coupled to the reference current. The second transistor has a second gate and a second drain respectively coupled to the first gate and the data-line terminal.

In an embodiment, the first gate is coupled to the first drain, and a voltage of the first drain is provided as the reference voltage. In another embodiment, the current limiter further includes a second amplifier, which has a pair of second input terminals and a second output terminal respectively coupled to the first drain, the reference voltage and the first gate.

An objective of the invention is to provide a flash memory includes a memory cell (a PMOS memory cell for example), a current limiter, a voltage comparator and a program voltage generator. The current limiter is coupled to the bit-line for reflecting amount of the program current by a data-line voltage of a data-line terminal. The voltage comparator is coupled to the data-line terminal for providing a control output (a digital signal, for example) in response to a comparison of the data-line voltage and a reference voltage. The program voltage generator is coupled to the control-line terminal and the voltage comparator for generating the program voltage in response to the control output, such that the program current tracks to a reference current. In an embodiment, the program voltage generator is arranged to raise the program voltage in response to a rising tendency of the program current.

In an embodiment, the program voltage generator includes a voltage divider, a feedback control circuit, an amplifier and a transistor. The voltage divider is coupled to the control-line terminal. The feedback control circuit is coupled to the control output for adjusting a division ratio of the voltage divider in response to the control output, and providing a feedback voltage according to the program voltage and the division ratio. The amplifier has a pair of input terminals and an output terminal, the pair of input terminals are respectively coupled to a second reference voltage and the feedback voltage. The transistor has a gate and a drain respectively coupled to the output terminal of the amplifier and the control-line terminal.

In an embodiment, the current limiter includes a first transistor and a second transistor. The first transistor has a first gate and a first drain, and the first drain is coupled to the reference current. The second transistor has a second gate and a second drain respectively coupled to the first gate and the data-line terminal. In an embodiment, the first gate is coupled to the first drain, and a voltage of the first drain is provided as the reference voltage. In another embodiment, the current limiter further includes a first amplifier which has a pair of first input terminals and a first output terminal respectively coupled to the first drain, the reference voltage and the first gate.

In an embodiment, the voltage comparator has a pair of first input terminals and a first output terminal, and the pair of the first input terminals is respectively coupled to the data-line terminal and the reference voltage. In an embodiment, the program voltage generator includes a voltage divider, a selection circuit, an amplifier and a driving transistor. The voltage divider has a first resistor terminal and a second resistor terminal, and the first resistor terminal is coupled to the control-line terminal. The selection circuit is coupled to the voltage comparator for selecting a second reference voltage from a plurality of candidate reference voltages in response to the control output. The amplifier has a pair of second input terminals and a second output terminal, the pair of second input terminals is respectively coupled to the second reference voltage and the second resistor terminal. The driving transistor has a first gate and a first drain respectively coupled to the second output terminal and the first resistor terminal.

In an embodiment, the program voltage generator includes a pump clock circuit and a pumping stage. The pump clock circuit is coupled to the voltage comparator for selectively providing a pumping clock in response to the control output, e.g., selectively starting or stopping toggling of the pumping clock. The pumping stage is coupled between the pump clock circuit and the control-line terminal for pumping the program voltage in response to toggling of the pumping clock.

In an embodiment, the program voltage generator includes a voltage divider, a feedback control circuit, an amplifier, a pump clock and a pumping stage. The voltage divider is coupled to the control-line terminal. The feedback control circuit is coupled to the voltage comparator for adjusting a division ratio of the voltage divider in response to the control output, and providing a feedback voltage according to the division ratio and the program voltage. The amplifier has a pair of input terminals and an output terminal, the pair of input terminals is respectively coupled to a second reference voltage and the feedback voltage. The pump clock circuit is coupled to the output terminal of the amplifier for selectively providing a pumping clock in response to a signal of the output terminal. The pumping stage is coupled between the pump clock circuit and the control-line terminal for pumping the program voltage in response to toggling of the pumping clock.

In an embodiment, the program voltage generator includes a first transistor and a second transistor, such as a PMOS transistor and a complementary n-channel MOS (NMOS) transistor. The first transistor has a first gate and a first drain commonly coupled to the control-line terminal. The second transistor has a second gate and a second drain respectively coupled to the control output and the first drain.

In an embodiment, the program voltage generator is arranged to raise the program voltage when the program current is greater than the reference current for a first duration, and to raise the program voltage again when the program current maintains greater than the reference current for a second duration after the first duration.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
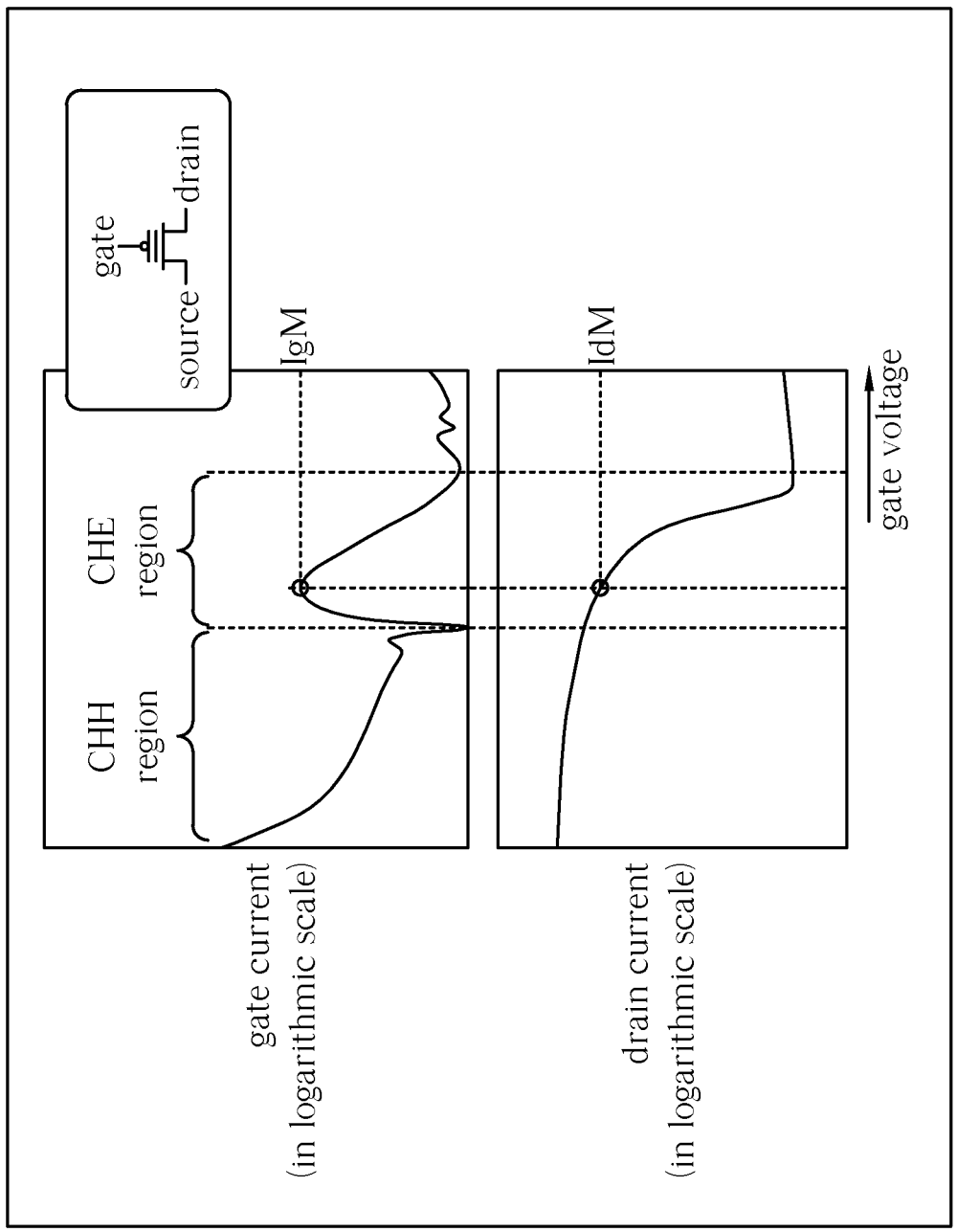
FIG. 1 illustrates characteristic curves of a PMOS storage transistor used in a memory cell of a flash memory.

Please refer to FIG. 1 illustrating characteristic curves of a PMOS storage transistor used in a memory cell of a flash memory. As voltages of the drain and the source of the PMOS storage transistor remain constant, the PMOS storage transistor works in a channel hot hole (CHH) region and conducts a higher drain current if a lower gate voltage is applied to the gate, and works in a channel hot electron (CHE) region to conduct lower drain current if a higher gate voltage is applied. In the CHE region, electrons generated in the channel between the source and the drain of the PMOS storage transistor can be used to program the PMOS storage transistor. In the CHH region, however, undesirable holes are generated in the channel, and therefore degrade programming of the PMOS storage transistor. Therefore, the gate voltage should be high enough to constrain conduction of the PMOS storage transistor, such that the PMOS storage transistor is driven to work in the CHE region. Preferably, the gate voltage is so supplied that the gate current is close to a current IgM, and hence the drain current is constrained around a current IdM, as shown in FIG. 1. During programming, because the threshold voltage of the PMOS storage transistor increases to cause a tendency to increase conduction (the drain current for example) of the PMOS transistor, the gate voltage is desired to be raised to counteract the increasing conduction.

Figure 2:
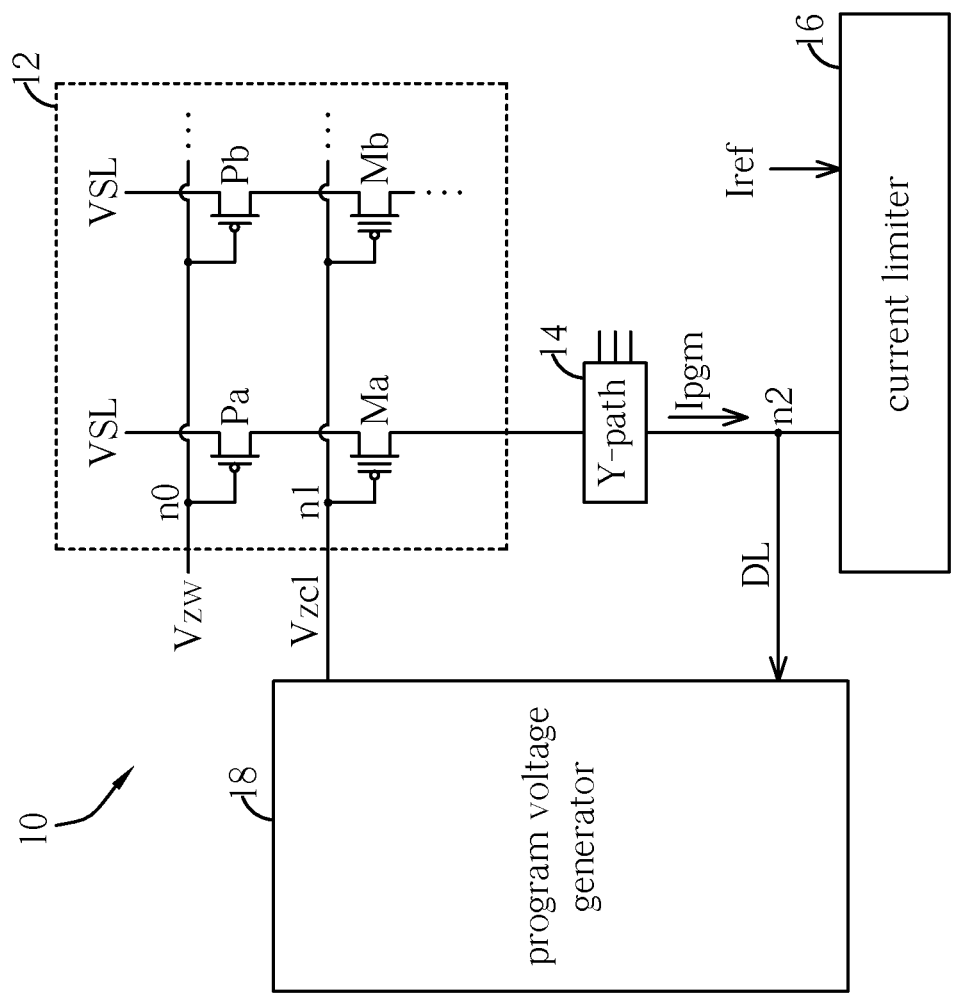
FIG. 2 illustrates a flash memory according to an embodiment of the invention.

Please refer to FIG. 2 illustrating a flash memory 10 according to an embodiment of the invention. The flash memory 10 includes a memory array 12, a Y-path circuit 14, a current limiter 16 and a program voltage generator 18. The memory array 12 includes a plurality of memory units, each memory unit include a selection transistor and a storage transistor which implements a memory cell, wherein a drain of the selection transistor is coupled to a source of the storage transistor along a data-line, so the selection transistor can control access to the storage transistor. Two memory units, for example, are shown in FIG. 2; one of the memory units includes transistors Pa and Ma as the selection transistor and the storage transistor, and another one of the memory units has transistors Pb and Mb as the selection transistor and the storage transistor. In an embodiment, the selection transistors are PMOS transistors, and the storage transistors are PMOS transistors with charge storage structures. Sources of the transistors Pa and Pb are coupled to a voltage VSL, and gates of the transistors Pa and Pb are commonly coupled to a voltage Vzw at a node n0. Along a control line, gates of the transistors Ma and Mb are commonly coupled to a voltage Vzcl (a program voltage) at a node n1 (a control-line terminal). Along a bit-line, a drain of the transistor Ma is coupled to a node n2 (a data-line terminal) through the Y-path circuit 14.

During programming of the transistor Ma, the voltage Vzw is set to turn on the transistor Pa, so a current Ipgm (a program current) is conducted through the drain and the source of the transistor Ma in response to the voltage Vzcl. The Y-path circuit 14 works to conduct the current Ipgm to the node n2. The current limiter 16 is coupled to the node n2 for receiving the current Ipgm; the current limiter 16 further receives a reference current Iref, and provides a voltage DL (a data-line signal) at the node n2 to reflect amount of the current Ipgm. The program voltage generator 18 is coupled between the nodes n1 and n2, for generating and controlling the voltage Vzcl in response to the voltage DL, such that the current Ipgm can track to the reference current Iref. That is, as programming of the transistor Ma is in progress, the current Ipgm tends to rise; in response to the voltage DL which reflects increasing of the current Ipgm, the program voltage generator 18 will raise the voltage Vzcl applied to the gate of the transistor Ma to decrease the current Ipgm. Therefore, the current Ipgm can be kept in close proximity of the reference current Iref to constrain conduction of the transistor Ma, and the transistor Ma is ensured to work in the CHE region instead of the CHH region. The increasing voltage Vzcl supplies more gate current to the gate of the transistor Ma, thus a faster program time (a shorter programming duration) and a higher programming efficiency are achieved. In addition, the constrained low drain current Ipgm can be supplied by circuits (e.g., a pumping circuit, not shown) of smaller layout area and lower power consumption.

Figure 3:
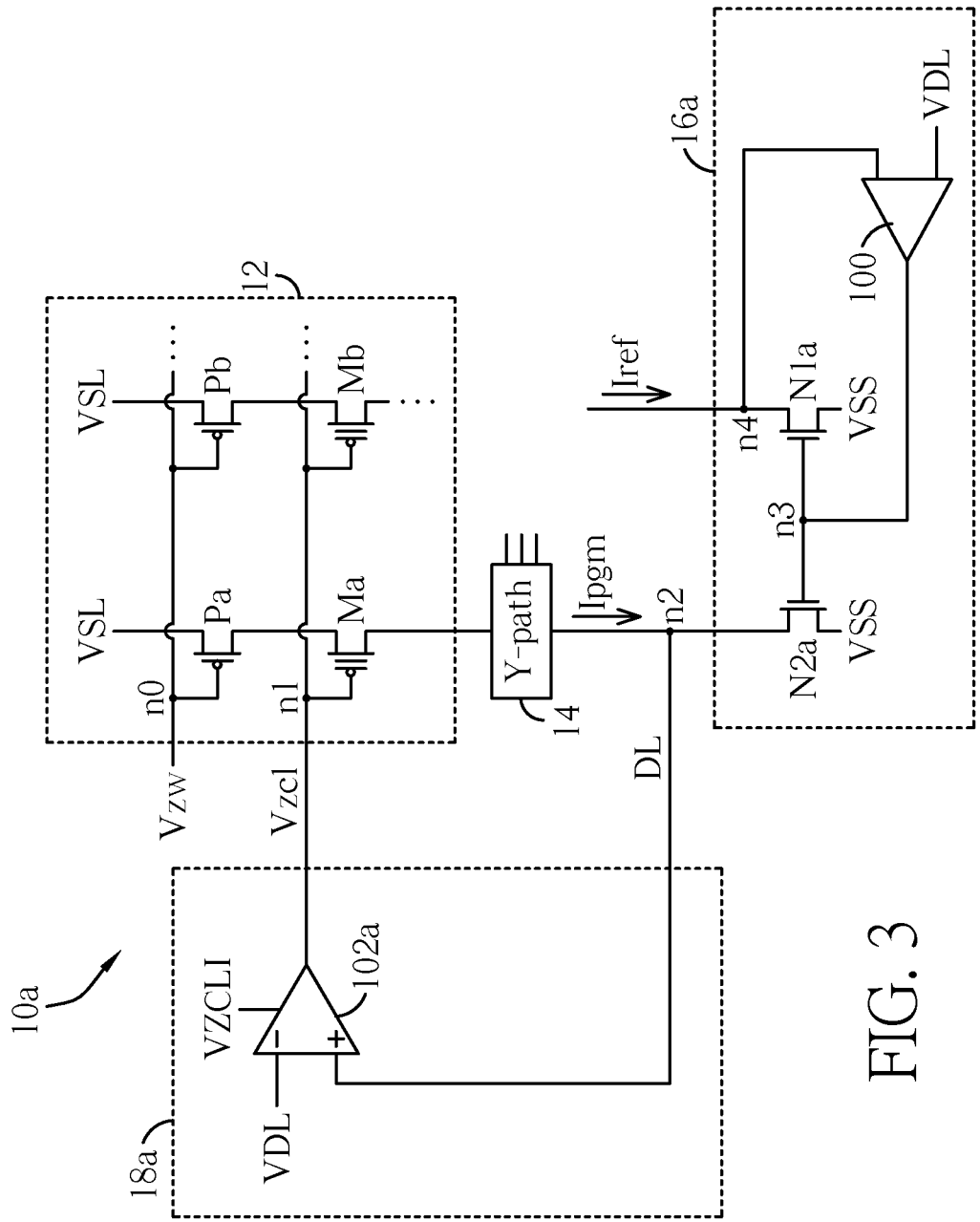
FIG. 3 illustrates a flash memory according to an embodiment of the invention.

Please refer to FIG. 3 illustrating a flash memory 10a according to an embodiment of the invention. Similar to the flash memory 10 shown in FIG. 2, the flash memory 10a in FIG. 3 includes the memory array 12, the Y-path circuit 14, a current limiter 16a and a program voltage generator 18a. The current limiter 16a includes two transistors (e.g., two NMOS transistors) N1a and N2a, and an amplifier (e.g., an operational amplifier) 100. The transistor N1a has a gate, a drain and a source respectively coupled to a node n3, a node n4 and a voltage VSS (e.g., a ground voltage), and a reference current Iref is supplied to the node n4. The transistor N2a has a gate, a drain and a source respectively coupled to the node n3, the node n2 and the voltage VSS. The amplifier 100 has a pair of input terminals and an output terminal respectively coupled to the node n4, a reference voltage VDL and the node n3. The program voltage generator 18a includes an amplifier (e.g., a differential amplifier) 102a, which is supplied by a voltage VZCLI, and has a positive input terminal, a negative input terminal and an output terminal respectively coupled to the node n2, the reference voltage VDL and the node n1.

The amplifier 100 associates the reference current Iref of the transistor N1a with the reference voltage VDL by virtual grounding between its two input terminals. In an embodiment, the reference current Iref and the reference voltage VDL retain constant during programming. Thus, the current mirror formed by the transistors N1a and N2a can limit amount of the current Ipgm in close proximity of the reference current Iref. Also, the voltage DL at the node n2 reflects amount of the current Ipgm. As the current Ipgm increases during programming of the transistor Ma, the voltage DL increases in response, and the amplifier 102a will raise the voltage Vzcl since a voltage difference between the voltage DL and the reference voltage VDL enlarges. Hence, conduction of the transistor Ma is constrained for enhanced programming.

Figure 4:
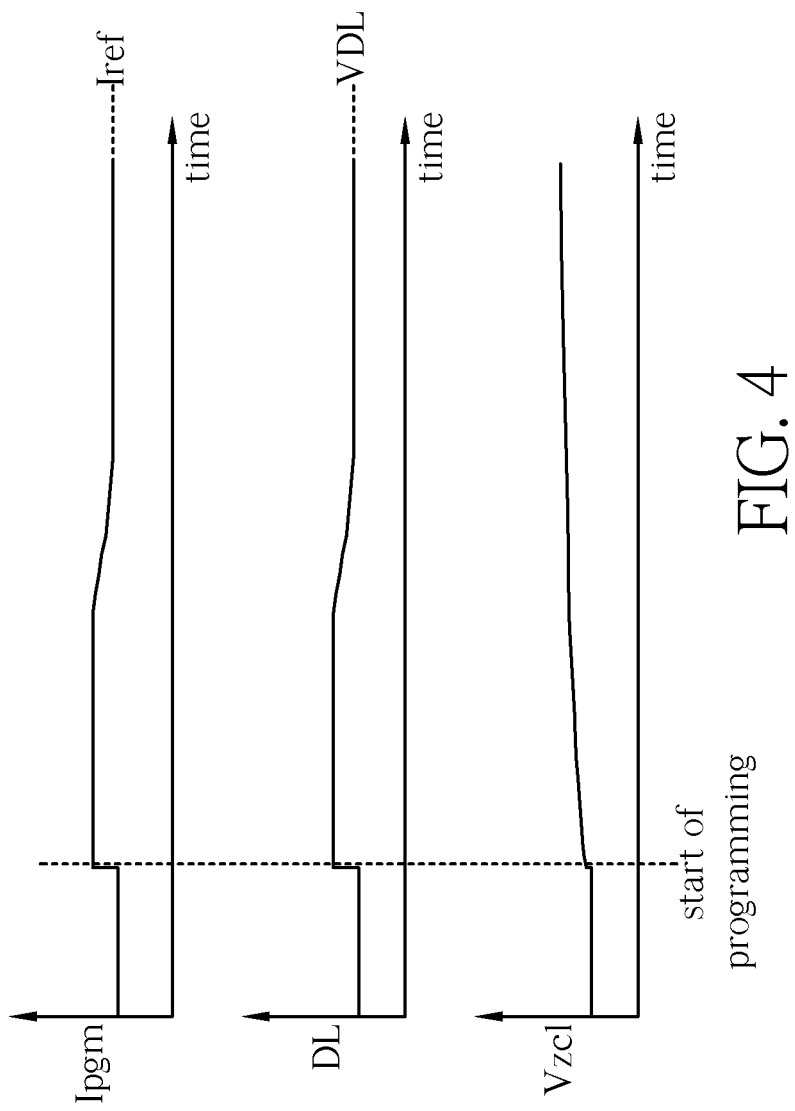
FIG. 4 illustrates waveforms of related signals in the flash memory of FIG. 3 according to an embodiment of the invention.

Please refer to FIG. 4 illustrating waveforms of related signals in the flash memory 10a according to an embodiment of the invention. As shown in FIG. 4, when the programming starts, the current Ipgm fed to the drain of the transistor Ma steps to a high level. Subsequently, the voltage DL also rises to a high level. In response to rising of the voltage DL, the program voltage generator 18a increases the voltage Vzcl applied to the gate of the transistor Ma. As the voltage Vzcl becomes greater, conduction of the transistor Ma is constrained, and the current Ipgm is thus reduced to track to the reference current Iref. In response to decreasing of the current Ipgm, the voltage DL also lowers to approach the reference voltage VDL.

In an embodiment, the voltages VSL, VZCLI and the reference voltage VDL for programming the flash memory 10a of FIG. 3 are respectively set to 5.7, 8.5 and 0.3 Volts, and the reference current Iref is set to 12 micro-Amps; during programming, the amplifier 102a raises the voltage Vzcl from 2.7 to 7.3 Volts, thus the current Ipgm is lowered from 13.3 to 12 micro-Amps, and the voltage DL is lowered from 1.6 to 0.3 Volts.

Figure 5:
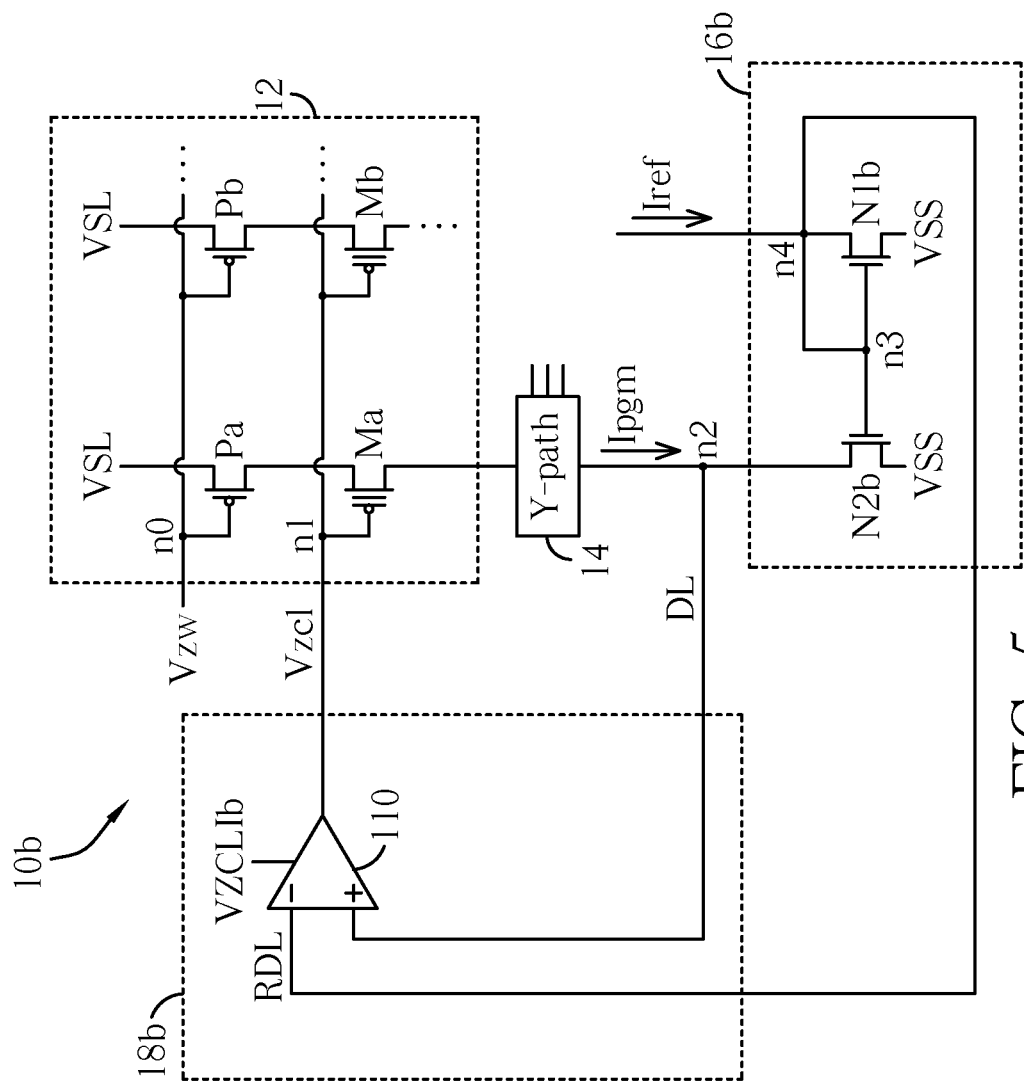
FIG. 5 illustrates a flash memory according to an embodiment of the invention.

Please refer to FIG. 5 illustrating a flash memory 10b according to an embodiment of the invention. Similar to the flash memory 10 shown in FIG. 2, the flash memory 10b in FIG. 5 includes the memory array 12, the Y-path circuit 14, a current limiter 16b and a program voltage generator 18b. The current limiter 16b includes two transistors N1b and N2b, e.g., two NMOS transistors. The transistor N1b has a gate, a drain and a source respectively coupled to a node n3, a node n4 and a voltage VSS; the node n3 is also coupled to the node n4, and a reference current Iref is supplied to the node n4. The transistor N2b has a gate, a drain and a source respectively coupled to the node n3, the node n2 and the voltage VSS. The program voltage generator 18b includes an amplifier (e.g., a differential amplifier) 110, which is supplied by a voltage VZCLIb, and has a positive input terminal, a negative input terminal and an output terminal respectively coupled to the nodes n2, n4 and n1. Because the node n4 is coupled to the negative input terminal of the amplifier 110, a voltage at the node n4 is provided as a reference voltage RDL. Different from the externally supplied reference voltage VDL in the flash memory 10a (FIG. 3), the reference voltage RDL in the flash memory 10b is internally built by operation of the current mirror formed by the transistors N1b and N2b.

In the current limiter 16b, the current mirror of the transistors N1b and N2b associates the reference current Iref to the built-it reference voltage RDL. While programming a transistor Ma in the memory array 12, rising of the current Ipgm is sensed by rising of the voltage DL, and the amplifier 110 in the program voltage generator 18b can therefore increase the voltage Vzcl to counteract increasing conduction of the transistor Ma. To support proper operation of the diode-connected transistor N1b, the reference voltage RDL in the flash memory 10b can be higher than the reference voltage VDL utilized in the flash memory 10a (FIG. 3). Accordingly, the voltage VZCLIb supplied to the amplifier 110 can be set higher than the voltage VZCLI supplied to the amplifier 102a. Because programming flash memory demands high voltages, the voltages VSL, VZCLI and VZCLIb shown in FIG. 2, FIG. 3 and FIG. 5 can be supplied by pumping.

Figure 6:
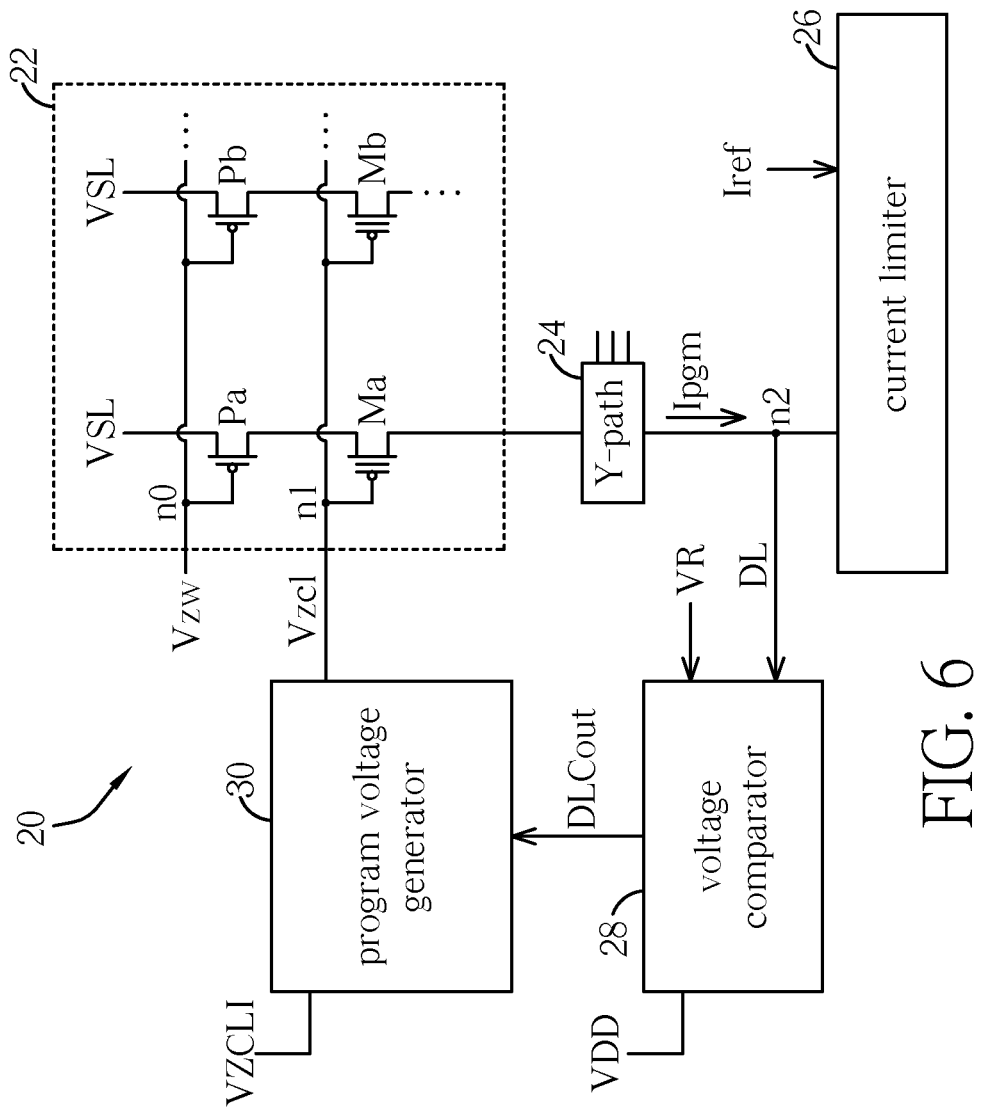
FIG. 6 illustrates a flash memory according to an embodiment of the invention.

Please refer to FIG. 6 illustrating a flash memory 20 according to an embodiment of the invention. The memory 20 includes a memory array 22, a Y-path circuit 24, a current limiter 26, a voltage comparator 28 and a program voltage generator 30. The memory array 22 includes a plurality of memory units, each memory unit include a selection transistor and a storage transistor as a memory cell. Two memory units, for example, are shown in FIG. 6; one of the memory units includes transistors Pa and Ma as the selection transistor and the storage transistor, and another one of the memory units has transistors Pb and Mb as the selection transistor and the storage transistor. In an embodiment, the selection transistors are PMOS transistors, and the storage transistors are PMOS transistors with charge storage structures. Sources of the transistors Pa and Pb are coupled to a voltage VSL, and gates of the transistors Pa and Pb are commonly coupled to a voltage Vzw at a node n0. Along a control line, gates of the transistors Ma and Mb are commonly coupled to a voltage Vzcl (a program voltage) at a node n1 (a control-line terminal). Along a bit-line, a drain of the transistor Ma is coupled to a node n2 (a data-line terminal) through the Y-path circuit 24.

During programming of the transistor Ma, the voltage Vzw is set to turn on the transistor Pa, so a current Ipgm (a program current) is conducted through the drain and the source of the transistor Ma in response to the voltage Vzcl. The Y-path circuit 24 works to conduct the current Ipgm to the node n2. The current limiter 26 is coupled to the node n2 for receiving the current Ipgm; the current limiter 26 also receives a reference current Iref, and provides a voltage DL (a data-line voltage) at the node n2 to reflect amount of the current Ipgm. The voltage comparator 28 is coupled to the node n2 for receiving the voltage DL, and provides a control output DLCout (a digital signal, for example) in response to a comparison of the voltage DL and a reference voltage VR. The program voltage generator 30 is coupled between the voltage comparator 28 and the node n1, and is arranged to generate/control the voltage Vzcl in response to the control output DLCout, such that the current Ipgm tracks to the reference current Iref.

In an embodiment, when the current Ipgm rises during programming of the transistor Ma, the voltage DL also rises. By comparison, the voltage comparator 28 reflects rising of the voltage DL by the control output DLCout; in response to the control output DLCout, the program voltage generator 30 is arranged to raise the voltage Vzcl, so the conduction of the transistor Ma is constrained. Hence, the flash memory 20 can gain advantages such as lower power consumption, smaller layout area, enhanced programming efficiency and shorter programming time.

In an embodiment, the voltage comparator 28 can be supplied (biased) by a normal (standard) voltage VDD to output a digital signal as the control output DLCout. On the other hand, the program voltage generator 30 can be supplied by a pumped high voltage VZCLI, so the voltage Vzcl provided by the program voltage generator 30 can be sufficiently raised for programming the memory array 22.

Figure 7:
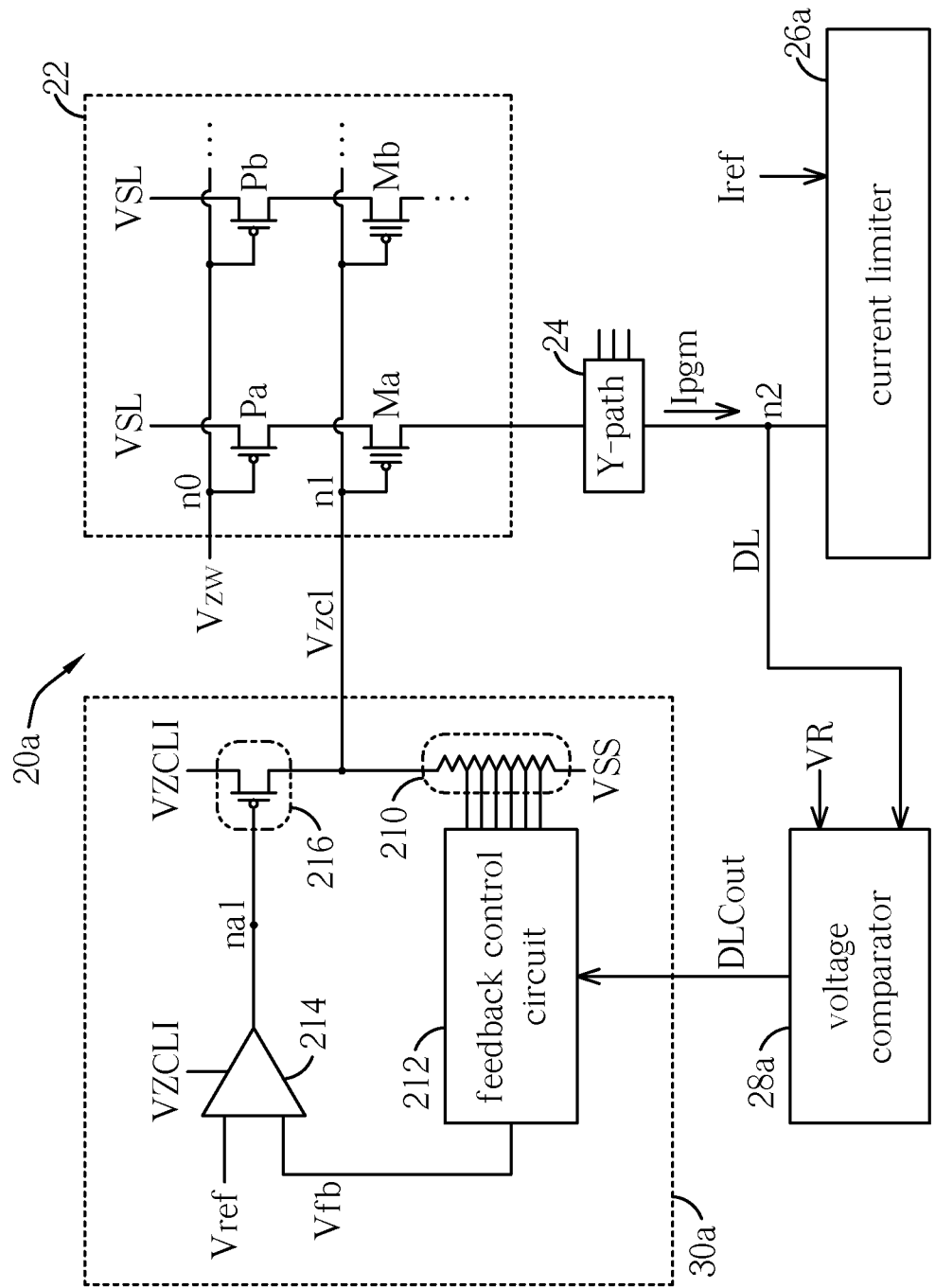
FIG. 7 illustrates a flash memory according to an embodiment of the invention.

Please refer to FIG. 7 illustrating a flash memory 20a according to an embodiment of the invention. Following the architecture of the flash memory 20 shown in FIG. 6, the flash memory 20a includes the memory array 22, the Y-path circuit 24, a current limiter 26a, a voltage comparator 28a and a program voltage generator 30a.

In the flash memory 20a, the program voltage generator includes a variable voltage divider 210, a feedback control circuit 212, an amplifier 214 and a transistor 216, e.g., a PMOS transistor. The voltage divider 210, e.g., a resistor voltage divider with a variable voltage division ratio Rv controlled by the feedback control circuit 212, is coupled between the node n1 and a voltage VSS, e.g., a ground voltage. The feedback control circuit 212 is coupled to the control output DLCout for adjusting the voltage division ratio Rv of the voltage divider 210 in response to the control output DLCout, and providing a feedback voltage Vfb which is a division of the voltage Vzcl, i.e., Vfb=Rv*Vzcl. The amplifier 214, supplied by the voltage VZCLI, has a pair of input terminals and an output terminal respectively coupled to a reference voltage Vref, the feedback voltage Vfb and a node na1. The transistor 216 has a source, a gate and a drain respectively coupled to the voltage VZCLI, the node na1 and the node n1. The reference voltages VR and Vref can be the same or different. In an embodiment, the structure of the program voltage generator 30a can be regarded as a low-drop out (LDO) voltage generator.

In an embodiment, the amplifier 214 controls the transistor 216, such that the transistor 216 conducts a current to the voltage divider 210 to establish the voltage Vzcl and the feedback voltage Vfb. The voltage comparator 28a transits the control output DLCout from a level L to a different level H when the voltage DL is greater than the reference voltage VR, and transits the control output DLCout from the level H to the level L when the voltage DL becomes less than the reference voltage VR. When the control output DLCout transits from the level L to the level H, the feedback control circuit 212 is triggered to decrease the division ratio Rv of the voltage divider 210. Because the amplifier 214 tends to keep the feedback voltage Vfb close to the reference voltage Vref by virtual grounding, the amplifier 214 enhances conduction of the transistor 216 to raise the feedback voltage Vfb built on the voltage divider 210 for counteracting the decreased division ratio Rv, and the voltage Vzcl is subsequently raised. On the other hand, the feedback control circuit 212 is not triggered to change the division ratio Rv of the voltage divider 210 when the control output DLCout transits from the level H to the level L, and hence the voltage Vzcl built on the voltage divider 210 will remain unchanged.

Figure 8:
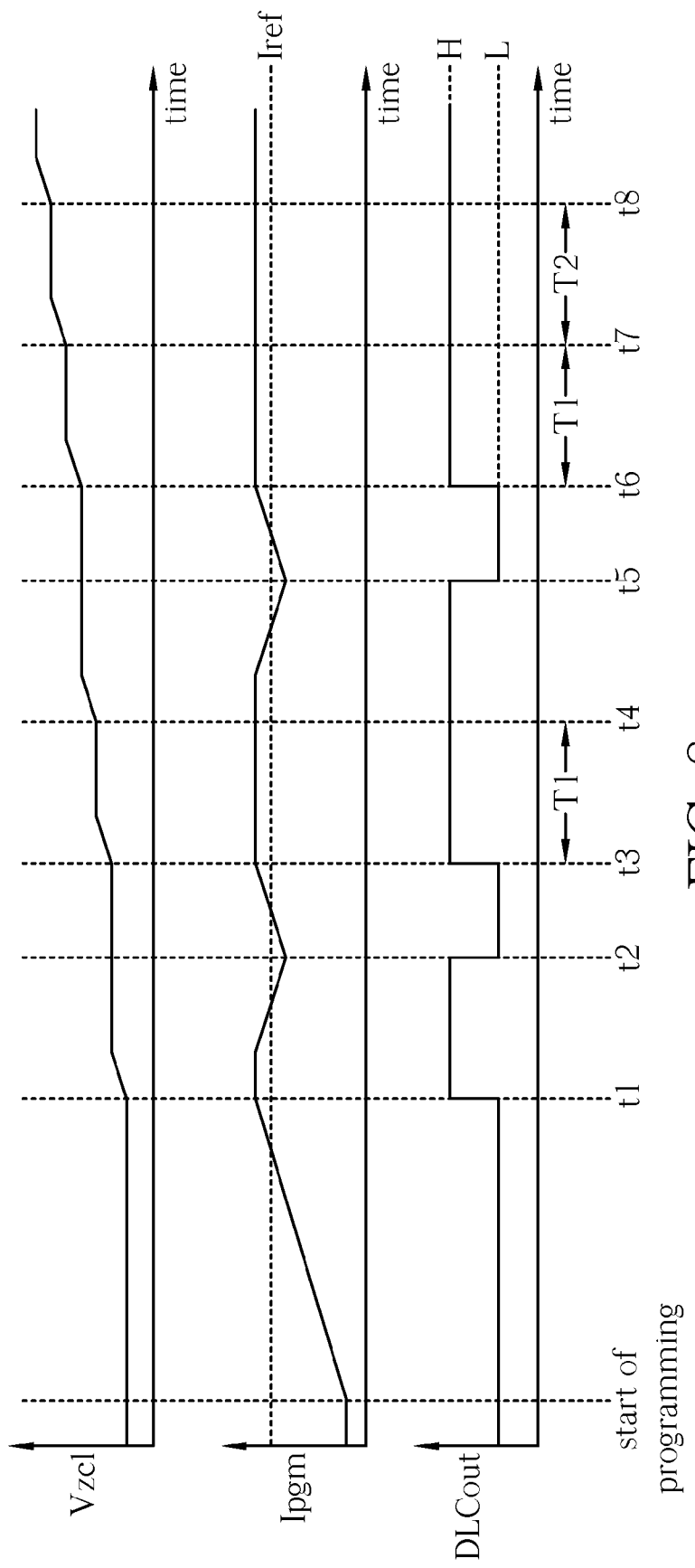
FIG. 8 illustrates waveforms of related signals in the flash memory of FIG. 7 according to an embodiment of the invention.

Please refer to FIG. 8 illustrating waveforms of related signals in the flash memory 20a according to an embodiment of the invention. After programming of the transistor Ma starts, the current Ipgm gradually rises. At time t1, because the current Ipgm grows higher than the reference current Iref, the voltage DL (not shown) grows higher than the reference voltage RL, and thus the voltage comparator 28a transits the control output DLCout from the level L to the level H. In response to transition of the control output DLCout, the feedback control circuit 212 change the division ratio Rv of the voltage divider 210, so the voltage Vzcl increases, and hence the current Ipgm is lowered. At time t2, the current Ipgm drops below the reference current Iref, the voltage DL accordingly drops below the reference voltage Vref, and the control output DLCout transits back to the level L by the voltage comparator 28a; the feedback control circuit 212 maintains the voltage Vzcl by keeping the division ratio Rv of the voltage divider 210 unchanged, since the feedback control circuit 212 does not change the division ratio Rv when the control output DLCout transits from the level H to the level L.

As programming continues to raise the threshold voltage of the transistor Ma, at time t3, the control output DLCout transits to the level H because the current Ipgm again rises greater than the reference current Iref. Accordingly, the feedback control circuit 212 adjusts the division ratio Rv of the voltage divider 210 to raise the voltage Vzcl.

After time t3, if the control output DLCout remains the level H for a predetermined duration T1, the feedback control circuit 212 will automatically adjust the division ratio Rv of the voltage divider 210, so the voltage Vzcl steps higher at time t4. At time t5, the control output DLCout transits back to the level L after the increased voltage Vzcl suppresses the current Ipgm. At time t6, the control output DLCout transits to the level H to reflect that the current Ipgm is again greater than the reference current Iref, and the feedback control circuit 212 responds by raising the voltage Vzcl. At time t7, one duration T1 elapses after time t6; if the control output DLCout still stays at the level H, the feedback control circuit 212 spontaneously causes the voltage Vzcl to increase. At time t8, a predetermined duration T2 elapses after time t7; if the control output DLCout still stays at the level H, the feedback control circuit 212 will cause the voltage Vzcl to increase again.

That is, if the control output DLCout remains the level H for an interval shorter than the duration T1 (from time t1 to t2, for example), the feedback control circuit 212 leaves the voltage Vzcl unchanged. If the control output DLCout remains the level H for an interval longer than the duration T1, the feedback control circuit 212 will cause the voltage Vzcl to step to a higher level. After the duration T1, the feedback control circuit 212 will periodically raise the voltage Vzcl on every duration T2, until the control output DLCout transits from the level H to the level L, or the voltage Vzcl reaches a predetermined maximum.

Figure 9:
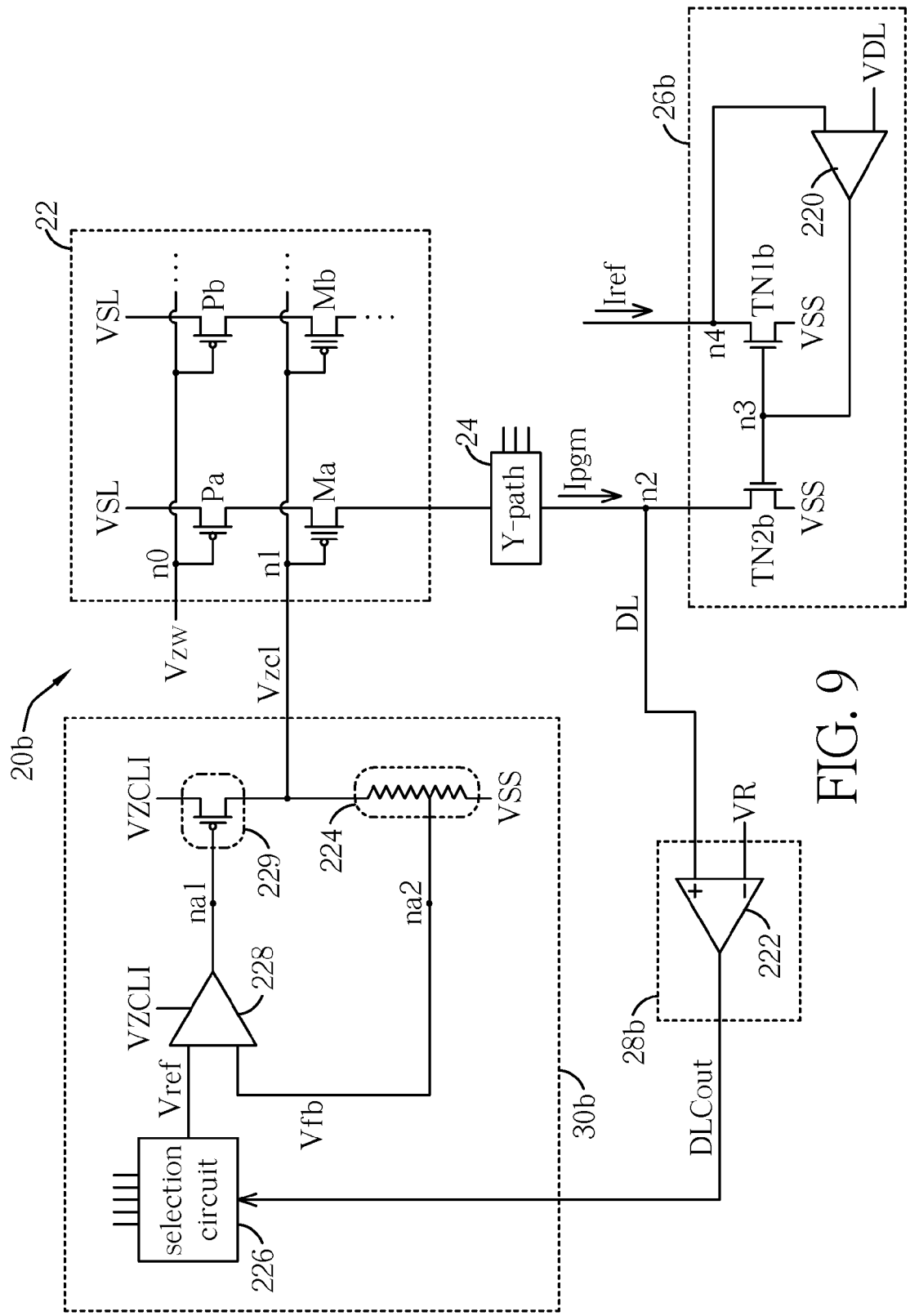
FIG. 9 illustrates a flash memory according to an embodiment of the invention.

Please refer to FIG. 9 illustrating a flash memory 20b according to an embodiment of the invention. Similar to the architecture of the flash memory 20 shown in FIG. 6, the flash memory 20b includes the memory array 22, the Y-path circuit 24, a current limiter 26b, a voltage comparator 28b and a program voltage generator 30b. The current limiter 26b includes an amplifier 220 and two transistors TN1b and TN2b, e.g., two NMOS transistors. The transistor TN1b has a gate, a drain and a source respectively coupled to the nodes n3, n4 and the voltage VSS, and the node n4 is coupled to the reference current Iref. The transistor TN2b has a gate, a drain and a source respectively coupled to the nodes n3, n2 and the voltage VSS. The current limiter 26b receives the reference current at the node n4, and receives the current Ipgm, which programs storage transistors such as the transistor Ma, at the node n2. The amplifier 220 has a pair of input terminals and an output terminal respectively coupled to the node n4, a reference voltage VDL and the node n3. The voltage comparator 28b is implemented by a comparator 222 which has a positive input terminal, a negative input terminal and an output terminal; the positive input terminal and the negative input terminal are respectively coupled to the node n2 and the reference voltage VR. The comparator 222 compares the voltage DL at the node n2 with the reference voltage VR, and outputs the comparison result as the control output DLCout to its output terminal.

The program voltage generator 30b includes a voltage divider 224, a selection circuit 226, an amplifier 228 and a transistor 229, e.g., a PMOS transistor. The voltage divider 224, a resistor voltage divider for example, has three resistor terminals respectively coupled to the node n1, a node na2 and the voltage VSS. The selection circuit 226 is coupled to the voltage comparator 30b for selecting a reference voltage Vref from a plurality of candidate reference voltages in response to the control output DLCout. The amplifier 228, supplied by the voltage VZCLI, has a pair of input terminals and an output terminal respectively coupled to the reference voltage Vref, the node na2 and a node na1. The transistor 229, as a driving transistor, has a gate, a drain and a source respectively coupled to the node na1, the node n1 and the voltage VZCLI.

In an embodiment, the reference voltage VDL equals the reference voltage VR. By the amplifier 220 and the current mirror formed by the transistors TN1b and TN2b, the reference current Iref is associated with the reference voltage VDL, the current Ipgm is associated with the voltage DL, so the relation between the current Ipgm and the reference current Iref can be reflected by comparing the voltage DL with the reference voltage VR.

According to the reference voltage Vref, the amplifier 228 drives the transistor 229 to conduct a current to the voltage divider 224 to build the voltage Vzcl, and a feedback voltage Vfb is also provided at the node na2. During programming of the transistor Ma, if the current Ipgm grows higher than the reference current Iref, the control output DLCout of the voltage comparator 28b triggers the selection circuit 226 to select a higher voltage value for updating the reference voltage Vref. The amplifier 228 therefore enhances driving of the transistor 229, so the feedback voltage Vfb can increase to reach the updated reference voltage Vref, and subsequently the voltage Vzcl for programming is increased to constrain conduction of the transistor Ma.

Figure 10:
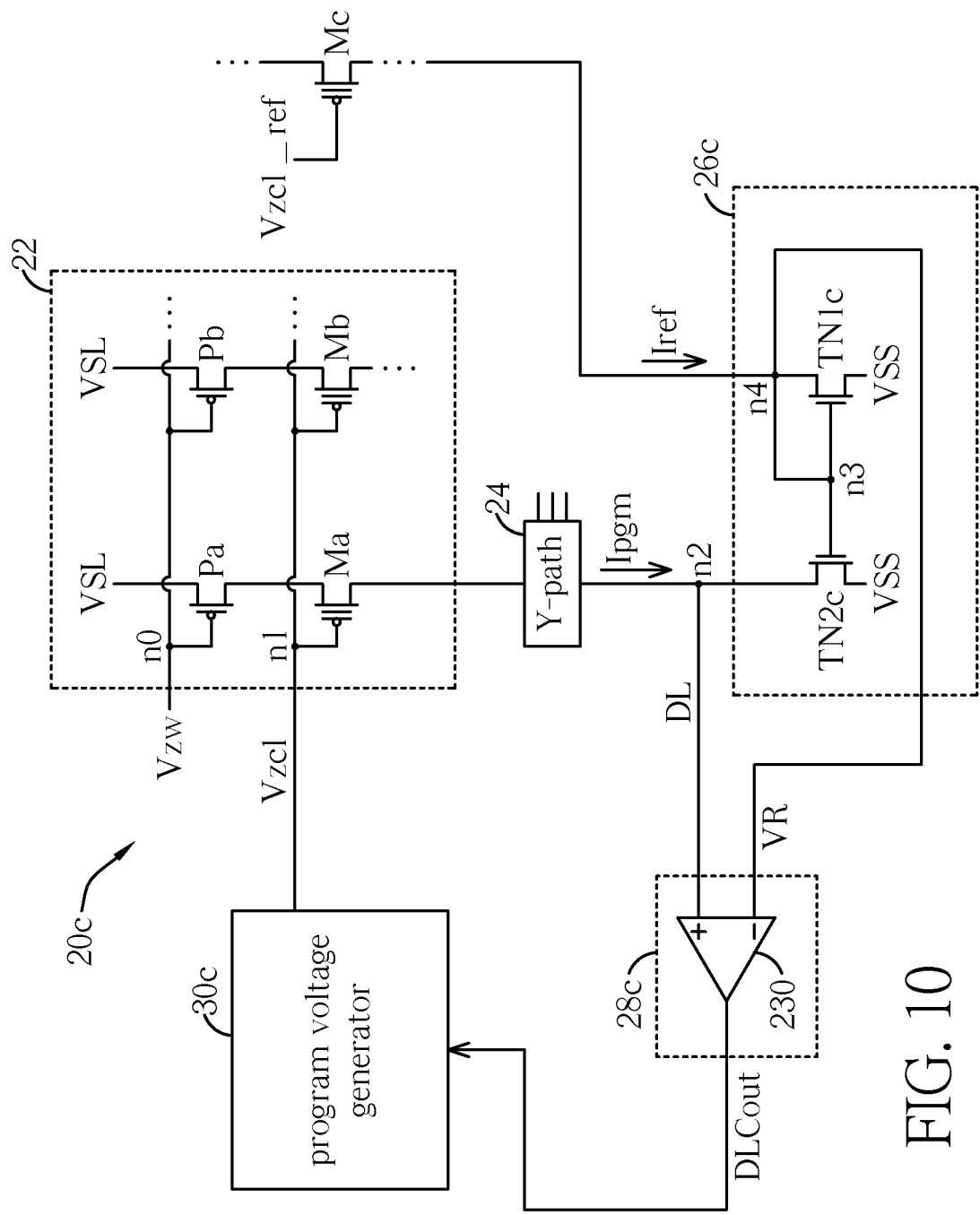
FIG. 10 illustrates a flash memory according to an embodiment of the invention.

Please refer to FIG. 10 illustrating a flash memory 20c according to an embodiment of the invention. Following the architecture and operation principle of the flash memory 20 shown in FIG. 6, the flash memory 20c also includes the memory array 22, the Y-path circuit 24, a current limiter 26c, a voltage comparator 28c and a program voltage generator 30c. During programming of the memory array 22, for example the transistor Ma, the current limiter 26c respectively receives a reference current Iref and a programming current Ipgm at nodes n4 and n2, and provides a reference voltage VR and a voltage DL respectively associated with the reference current Iref and the current Ipgm. The voltage comparator 28c, implemented by a comparator 230, compares the voltage DL and the reference voltage VR to provide a control output DLCout for reflecting a relation between the current Ipgm and the reference current Iref. According to the control output DLCout, the program voltage generator 30c provides a voltage Vzcl fed to the gate of the transistor Ma.

In the embodiment shown in FIG. 10, the current limiter 26c includes two transistors TN1c and TN2c, e.g., two NMOS transistors. The transistor TN1c has a gate, a drain and a source respectively coupled to the nodes n3, n4 and the voltage VSS, the transistor TN2c has a gate, a drain and a source respectively coupled to the nodes n3, n2 and the voltage VSS; the nodes n3 is also coupled to the node n4. Thus, the voltage at the node n4 can be provided as the reference voltage VR. The reference current Iref can be provided by a reference memory cell, such as a storage transistor Mc. In an embodiment, the transistor Mc is a duplicate of the transistor Ma, and functions as a redundant memory cell; the gate of the transistor Mc is biased by a voltage Vzcl_ref. Therefore, the reference current Iref provided by the transistor Mc can reflect characteristics, such as manufacture process variations, of the transistor Ma.

Figure 11:
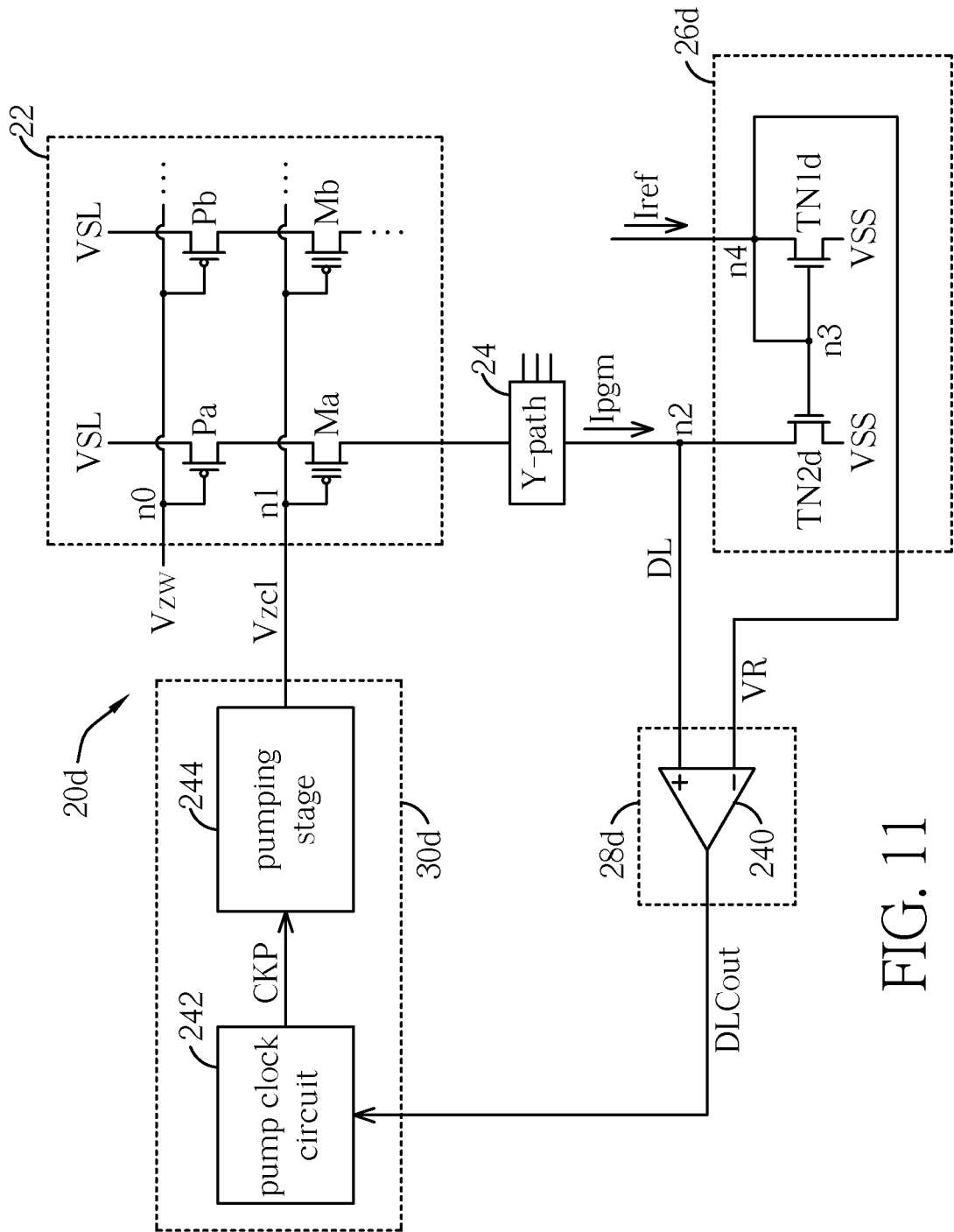
FIG. 11 illustrates a flash memory according to an embodiment of the invention.

Please refer to FIG. 11 illustrating a flash memory 20$d$ according to an embodiment of the invention. Similar to the architecture and operation principle of the flash memory 20 shown in FIG. 6, the flash memory 20$d$ also includes the memory array 22, the Y-path circuit 24, a current limiter 26$d$, a voltage comparator 28$d$ and a program voltage generator 30$d$. While programming the transistor Ma of the memory array 22, the current limiter 26$d$ respectively receives the reference current Iref and the programming current Ipgm at the nodes n4 and n2, and provides the reference voltage VR and the voltage DL respectively associated with the reference current Iref and the current Ipgm. The voltage comparator 28$d$, implemented by a comparator 240, compares the voltage DL and the reference voltage VR to provide the control output DLCout for reflecting the relation between the current Ipgm and the reference current Iref. According to the control output DLCout, the program voltage generator 30$d$ provides the voltage Vzcl for the gate of the transistor Ma.

The current limiter 26$d$ includes two transistors TN1$d$ and TN2$d$, e.g., two NMOS transistors. The transistor TN1$d$ has a gate, a drain and a source respectively coupled to the nodes n3, n4 and the voltage VSS, the transistor TN2$d$ has a gate, a drain and a source respectively coupled to the nodes n3, n2 and the voltage VSS; the node n3 is also coupled to the node n4, and the voltage at the node n4 is provided as the reference voltage VR. The program voltage generator 30$d$ includes a pump clock circuit 242 and a pumping stage 244. The pump clock circuit 242 is coupled to the voltage comparator 28$d$ for selectively providing a pumping clock CKP in response to the control output DLCout, e.g., selectively starting or topping toggling of the pumping clock CKP according to the control output DLCout. The pumping stage 244 is coupled between the pump clock circuit 242 and the node n1 for pumping the voltage Vzcl in response to toggling of the pumping clock CKP. In an embodiment, the pumping stage 244 keeps on raising the voltage Vzcl when the pumping clock CKP toggles, and keeps the voltage Vzcl unchanged when the pumping clock CKP does not toggle.

During programming of the transistor Ma, if the current Ipgm exceeds the reference current Iref, the voltage comparator 28$d$ reflects the relation transition in the control output DLCout. In response to the control DLCout, the pump clock circuit 242 starts to toggle the pumping clock CKP, and the pumping stage 244 raise the voltage Vzcl due to toggling of the pumping clock CKP. On the other hand, if the current Ipgm is suppressed below the reference current Iref, the pump clock circuit 242 stops toggling of the pumping clock CKP in response to the control output DLCout, and thus the voltage Vzcl is left unchanged.

Figure 12:
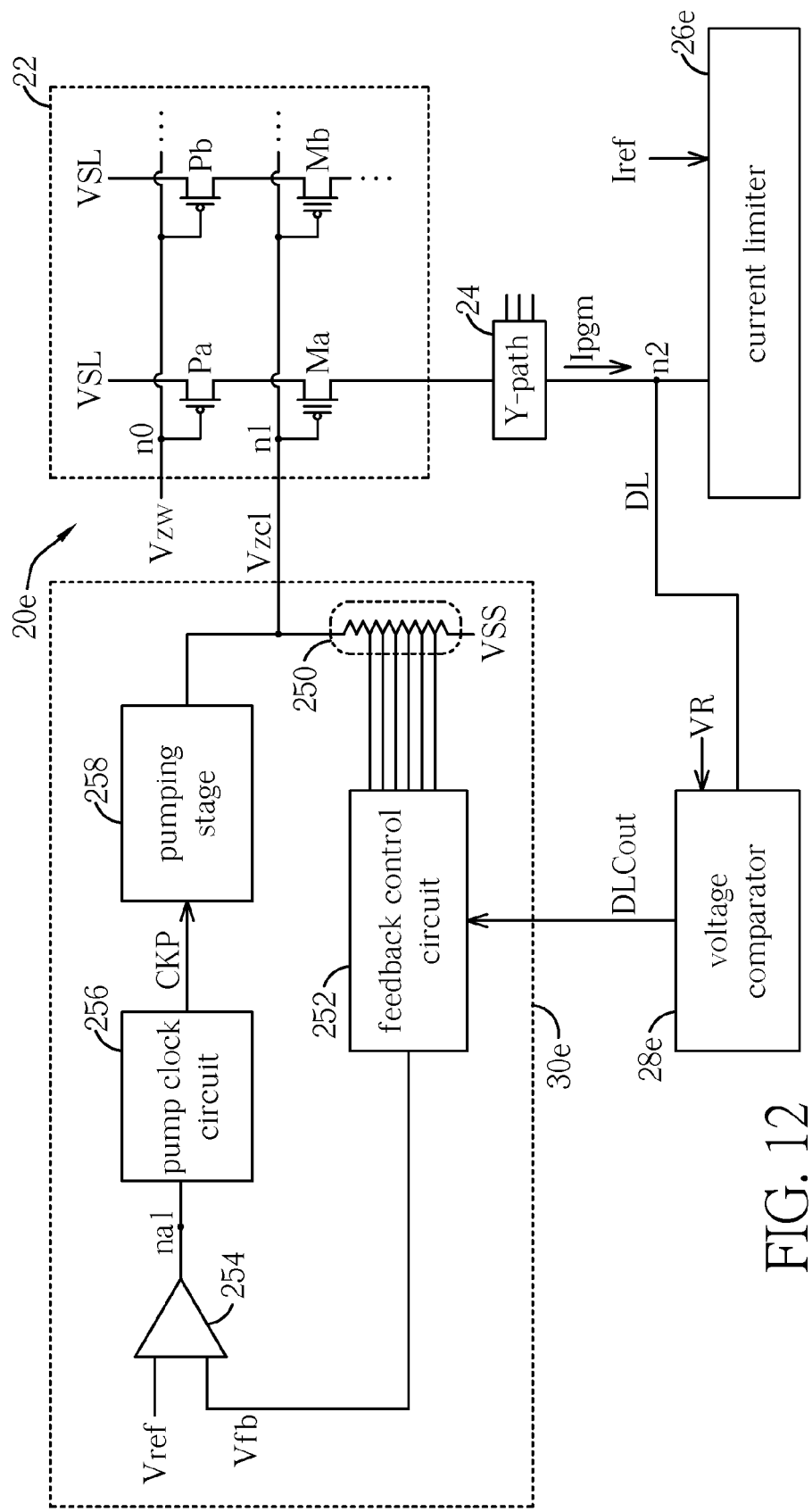
FIG. 12 illustrates a flash memory according to an embodiment of the invention.

Please refer to FIG. 12 illustrating a flash memory 20$e$ according to an embodiment of the invention. Following the architecture and operation principle of the flash memory 20 shown in FIG. 6, the flash memory 20$e$ also includes the memory array 22, the Y-path circuit 24, a current limiter 26$e$, a voltage comparator 28$e$ and a program voltage generator 30$e$. During programming of the transistor Ma, the current limiter 26$e$ receives the reference current Iref and the programming current Ipgm, and provides the voltage DL associated with the current Ipgm. The voltage comparator 28$e$ compares the voltage DL and the reference voltage VR to provide the control output DLCout for reflecting the relation between the current Ipgm and the reference current Iref. According to the control output DLCout, the program voltage generator 30$e$ provides the voltage Vzcl to the gate of the transistor Ma.

As shown in FIG. 12, the program voltage generator 30$e$ includes a voltage divider 250, a feedback control circuit 252, an amplifier 254, a pump clock 256 and a pumping stage 258. The voltage divider 250 is coupled between the node n1 and the voltage VSS. The feedback control circuit 252 is coupled to the voltage comparator 28$e$ for adjusting a division ratio of the voltage divider 250 in response to the control output DLCout, and providing a feedback voltage Vfb according to the division ratio and the voltage Vzcl. The amplifier 254 has a pair of input terminals and an output respectively coupled to a reference voltage Vref, the feedback voltage Vfb and a node na1. The pump clock circuit 256 is coupled to the node na1 for selectively toggling a pumping clock CKP in response to a signal at the node na1. The pumping stage 258 is coupled between the pump clock circuit 256 and the node n1 for pumping the voltage Vzcl in response to toggling of the pumping clock CKP.

Operation of the program voltage generator 30$e$ is similar to that of the program voltage generator 30$a$ shown in FIG. 7, except that the amplifier 254 causes the voltage Vzcl to rise by driving the pump clock circuit 256 and the pump stage 258, instead of the transistor 216. During programming, if the current Ipgm for programming grows higher than the reference current Iref, the feedback control circuit 252 adjusts the division ratio of the voltage divider 250 to lower the feedback voltage Vfb. To counteract decreasing of the feedback voltage Vfb, the pump clock circuit 256 toggles the pumping clock CKP, so the pumping stage 258 raises the feedback voltage Vfb by pumping, and the voltage Vzcl is subsequently increased to suppress the current Ipgm.

Figure 13:
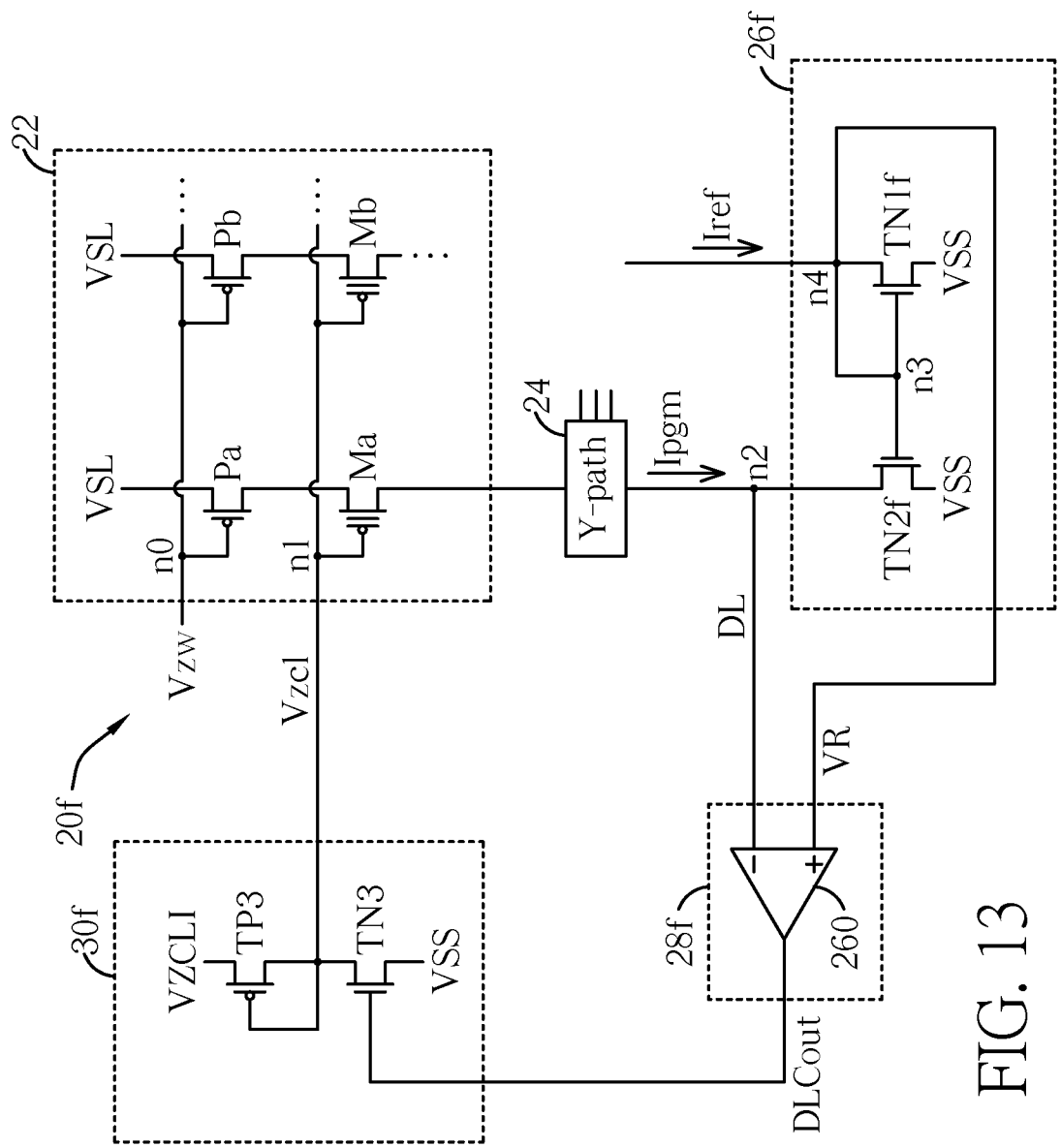
FIG. 13 illustrates a flash memory according to an embodiment of the invention.

Please refer to FIG. 13 illustrating a flash memory 20$f$ according to an embodiment of the invention. Similar to the architecture and operation principle of the flash memory 20 shown in FIG. 6, the flash memory 20$f$ also includes the memory array 22, the Y-path circuit 24, a current limiter 26$f$, a voltage comparator 28$f$ and a program voltage generator 30$f$. During programming the transistor Ma, the current limiter 26$f$ respectively receives the reference current Iref and the programming current Ipgm at the nodes n4 and n2, and provides the reference voltage VR and the voltage DL respectively associated with the reference current Iref and the current Ipgm. The voltage comparator 28$f$ compares the voltage DL and the reference voltage VR to provide the control output DLCout for reflecting the relation between the current Ipgm and the reference current Iref. According to the control output DLCout, the program voltage generator 30$f$ provides and adaptively controls the voltage Vzcl.

As shown in FIG. 13, the current limiter 26$f$ includes two transistors TN1$f$ and TN2$f$, e.g., two NMOS transistors. The transistor TN1$f$ has a gate, a drain and a source respectively coupled to the nodes n3, n4 and the voltage VSS, the transistor TN2$f$ has a gate, a drain and a source respectively coupled to the nodes n3, n2 and the voltage VSS; the nodes n3 is also coupled to the node n4, and the voltage at the node n4 is provided as the reference voltage VR. The voltage comparator 28$f$ is implemented by a comparator 260, which has a positive input terminal, a negative input terminal and an output terminal respectively coupled to the reference voltage VR, the voltage DL and the program voltage generator 30$f$. The program voltage generator 30f includes two transistors TP3 and TN3, such as a PMOS transistor and a complementary NMOS transistor. The transistor TP3 has a gate, a source and a drain respectively coupled to the node n1, the voltage VZCLI and the node n1. The transistor TN3 has a gate, a drain and a source respectively coupled to the control output DLCout, the node n1 and the voltage VSS.

During programming, if the current Ipgm for programming becomes higher than the reference voltage Iref, the comparator 260 adjusts conduction of the transistor TN3, such that the voltage Vzcl for programming increases to suppress the current Ipgm.

To sum up, the programming circuitry according to the invention can adaptively adjusts the gate program voltage supplied to the memory cell, so the drain current for programming can be dynamically constrained to a predetermined reference current. Accordingly, circuitry for pumping the drain current can be reduced to a smaller layout area and consumes less power. Also, programming efficiency and reliability of memory cells can be enhanced and improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A flash memory comprising:
    a memory cell capable of being programmed in response to a program current of a bit-line and a program voltage of a control-line terminal,
    a current limiter coupled to the bit-line for reflecting amount of the program current by a data-line voltage of a data-line terminal;
    a voltage comparator coupled to the data-line terminal for providing a control output in response to a comparison of the data-line voltage and a reference voltage, and
    a program voltage generator, coupled to the control-line terminal and the voltage comparator, for generating the program voltage in response to the control output, such that the program current tracks to a reference current.

2. The flash memory of claim 1, wherein the program voltage generator is arranged to raise the program voltage in response to a rising tendency of the program current.

3. The flash memory of claim 1, wherein the control output is a digital signal.

4. The flash memory of claim 1, wherein the program voltage generator comprises:
    a voltage divider coupled to the control-line terminal,
    a feedback control circuit coupled to the control output for adjusting a division ratio of the voltage divider in response to the control output, and providing a feedback voltage according to the program voltage and the division ratio,
    an amplifier comprising a pair of input terminals and an output terminal, the pair of input terminals being respectively coupled to a second reference voltage and the feedback voltage; and
    a transistor comprising a gate and a drain respectively coupled to the output terminal and the control-line terminal.

5. The flash memory of claim 1, wherein the current limiter comprises:
    a first transistor comprising a first gate and a first drain, the first drain being coupled to the reference current; and
    a second transistor comprising a second gate and a second drain respectively coupled to the first gate and the data-line terminal.

6. The flash memory of claim 5, wherein the current limiter further comprises:
    a first amplifier comprising a pair of first input terminals and a first output terminal respectively coupled to the first drain, the reference voltage and the first gate.

7. The flash memory of claim 5, wherein the first gate is coupled to the first drain, and a voltage of the first drain is provided as the reference voltage.

8. The flash memory of claim 1, wherein the voltage comparator comprises a pair of first input terminals and a first output terminal, the pair of the first input terminals being respectively coupled to the data-line terminal and the reference voltage, wherein the control output is outputted from the first output terminal.

9. The flash memory of claim 8, wherein the program voltage generator comprises:
    a voltage divider comprising a first resistor terminal and a second resistor terminal, the first resistor terminal being coupled to the control-line terminal;
    a selection circuit coupled to the voltage comparator for selecting a second reference voltage from a plurality of candidate reference voltages in response to the control output;
    an amplifier comprising a pair of second input terminals and a second output terminal, the pair of second input terminals being respectively coupled to the second reference voltage and the second resistor terminal; and
    a driving transistor comprising a first gate and a first drain respectively coupled to the second output terminal and the first resistor terminal.

10. The flash memory of claim 1 further comprises a reference memory cell for providing the reference current.

11. The flash memory of claim 1, wherein the program voltage generator comprises:
    a pump clock circuit coupled to the voltage comparator for selectively providing a pumping clock in response to the control output, and
    a pumping stage coupled between the pump clock circuit and the control-line terminal for pumping the program voltage in response to toggling of the pumping clock.

12. The flash memory of claim 1, wherein the program voltage generator comprises:
    a voltage divider coupled to the control-line terminal,
    a feedback control circuit coupled to the voltage comparator for adjusting a division ratio of the voltage divider in response to the control output, and providing a feedback voltage according to the division ratio and the program voltage,
    an amplifier comprising a pair of input terminals and an output terminal, the pair of input terminals being respectively coupled to a second reference voltage and the feedback voltage;
    a pump clock circuit coupled to the output terminal for selectively providing a pumping clock in response to a signal of the output terminal, and
    a pumping stage coupled between the pump clock circuit and the control-line terminal for pumping the program voltage in response to toggling of the pumping clock.

13. The flash memory of claim 1, wherein the program voltage generator comprises:
    a first transistor comprising a first gate and a first drain commonly coupled to the control-line terminal, and a second transistor comprising a second gate and a second drain respectively coupled to the control output and the first drain.

14. The flash memory of claim 1, wherein the program voltage generator is arranged to raise the program voltage when the program current is greater than the reference current for a first duration.

15. The flash memory of claim 14, wherein the program voltage generator is further arranged to raise the program voltage again when the program current maintains greater than the reference current for a second duration after the first duration.

* * * * *